(12) United States Patent
Brask et al.

(10) Patent No.: US 7,615,441 B2
(45) Date of Patent: Nov. 10, 2009

(54) FORMING HIGH-K DIELECTRIC LAYERS ON SMOOTH SUBSTRATES

(75) Inventors: Justin K. Brask, Portland, OR (US); Jack Kavalieros, Portland, OR (US); Mark L. Doczy, Beaverton, OR (US); Matthew V. Metz, Hillsboro, OR (US); Suman Datta, Beaverton, OR (US); Uday Shah, Portland, OR (US); Gilbert Dewey, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/998,236

(22) Filed: Nov. 29, 2007

(65) Prior Publication Data

US 2008/0087985 A1  Apr. 17, 2008

Related U.S. Application Data

(62) Division of application No. 10/882,734, filed on Jun. 30, 2004, now Pat. No. 7,323,423.

(51) Int. Cl.
*H01L 21/8242* (2006.01)

(52) U.S. Cl. ............... 438/240; 438/3; 257/E21.215; 257/E21.24

(58) Field of Classification Search ............... 438/3, 438/240; 257/E21.215, E21.24
See application file for complete search history.

(56) References Cited

U.S. PATENT DOCUMENTS

| | | | | |
|---|---|---|---|---|
| 6,452,229 | B1 * | 9/2002 | Krivokapic | 257/330 |
| 6,504,214 | B1 * | 1/2003 | Yu et al. | 257/347 |
| 6,627,556 | B1 * | 9/2003 | Aronowitz et al. | 438/710 |
| 2004/0198069 | A1 * | 10/2004 | Metzner et al. | 438/785 |

* cited by examiner

*Primary Examiner*—Michelle Estrada
(74) *Attorney, Agent, or Firm*—Trop, Pruner & Hu, P.C.

(57) ABSTRACT

A buffer layer and a high-k metal oxide dielectric may be formed over a smooth silicon substrate. The substrate smoothness may reduce column growth of the high-k metal oxide gate dielectric. The surface of the substrate may be saturated with hydroxyl terminations prior to deposition.

6 Claims, 2 Drawing Sheets

FORMING HIGH-K DIELECTRIC LAYERS ON SMOOTH SUBSTRATES

CROSS-REFERENCE TO RELATED APPLICATIONS

This application is a divisional of U.S. patent application Ser. No. 10/882,734, filed on Jun. 30, 2004 now U.S. Pat. No. 7,323,423.

BACKGROUND

The present invention relates to methods for making semiconductor devices, in particular, semiconductor devices that include high-k gate dielectric layers.

MOS field-effect transistors with very thin silicon dioxide based gate dielectrics may experience unacceptable gate leakage currents. Forming the gate dielectric from certain high dielectric constant (k) dielectric materials, instead of silicon dioxide, can reduce gate leakage. A high dielectric constant is greater than 10. Such a dielectric may not, however, be compatible with polysilicon—the preferred material for making the device's gate electrode.

When the gate dielectric includes a high-k film, a thin layer of silicon dioxide or silicon oxynitride may be formed between the channel and the high-k film to maintain acceptable electron mobility on the high-k film. When an electrically very thin gate dielectric is comprised of such a buffer layer, the buffer layer must be extremely thin, e.g., less than about 10 Angstroms thick. When such an ultra-thin high-k film comprises an oxide, it may manifest oxygen vacancies and excess impurity levels. Oxygen vacancies may permit undesirable interaction between the high-k film and the gate electrode. When the gate electrode comprises polysilicon, such interaction may alter the electrode's workfunction or cause the device to short through the dielectric.

Accordingly, there is a need for an improved process for making a semiconductor device that includes a high-k dielectric.

DETAILED DESCRIPTION

Figure 1:
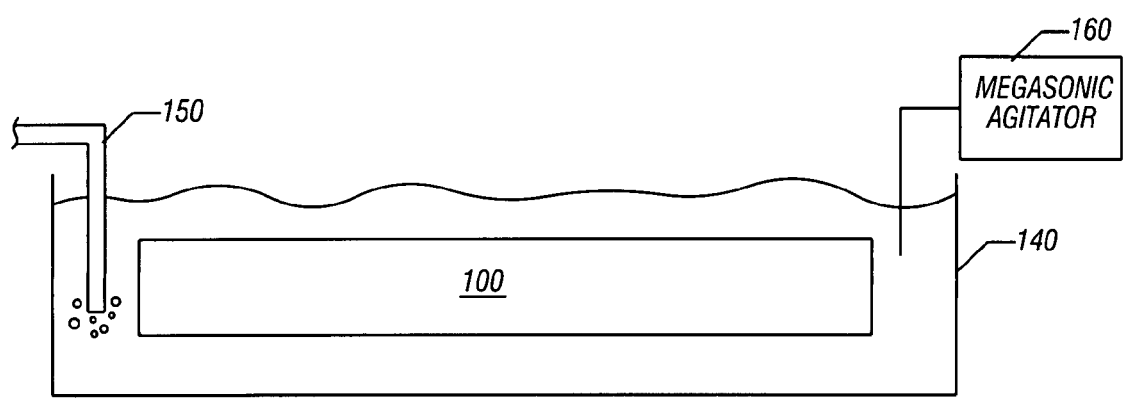
FIG. 1 is a schematic depiction of a wafer being treated in accordance with one embodiment of the present invention.

Referring to FIG. 1, a substrate 100 may comprise a bulk silicon or silicon-on-insulator wafer. Alternatively, it may comprise other materials—which may or may not be combined with silicon—such as: germanium, indium antimonide, lead telluride, indium arsenide, indium phosphide, gallium arsenide, or gallium antimonide. Although several examples of materials from which the substrate may be formed are described here, any material that may serve as a foundation or base upon which a semiconductor device may be built falls within the spirit and scope of the present invention.

The substrate 100 may be cleaned before forming a buffer layer and a high-k gate dielectric layer on its surface. The wafer may be exposed to a water/$H_2O_2$/$NH_4OH$ solution, then to a water/$H_2O_2$/HCl solution. The water/$H_2O_2$/$NH_4OH$ solution may remove particles and organic contaminants, and the water/$H_2O_2$/HCl solution may remove metallic contaminants.

Referring to FIG. 1, a tank 140 may include a liquid in which the wafer 100 is immersed. A tube 150 may be coupled to a supply of ozone which may be pumped into the liquid within the tank 140. A megasonic agitator 160 may supply megasonic energy to the liquid in the tank 140 and, ultimately, to the wafer 100. The liquid may be $H_2O_2$.

Extreme wafer 100 surface uniformity or smoothness may be achieved by treating with both megasonic energy and ozone. Without limiting the scope of the present invention, the sonic energy may drive a hydroxyl surface saturation reaction, by providing energy to overcome any surface potential energy that would otherwise inhibit termini substitution.

The megasonic actuator 160 may operate at 650 to 1050 kHz, most preferably 750 kHz, dissipating between 1 to 5 W/cm$^2$ of power with a preferred range of around 2 W/cm$^2$. The ozone from the pipe 150 is dissolved in the liquid in the tank 140.

The hydroxyl terminations on the silicon surface of the wafer 100 may be saturated after cleaning the substrate 100. For example, in one embodiment of the present invention, any hydroxyl groups on the silicon surface may be reacted with a metal chloride. This reaction may be driven in a vacuum in one embodiment of the present invention. In another embodiment, the reaction may be driven in the tank 140. The metal utilized to saturate the hydroxyls may be hafnium, zirconium, lanthanum, aluminum, or any of the other metals used to formed the high-k metal oxide dielectrics.

In one embodiment of the present invention, a metal chloride is applied to the wafer surface, for example, by spraying or immersion. The metal chloride attaches to the oxygen atom of the hydroxyl termination, replacing the hydrogen atom of a hydroxyl termination attached to the wafer 100. Then, the chlorine atoms are replaced by hydroxyls to saturate the silicon surface with hydroxyls.

In some embodiments of the present invention, a higher concentration of hydroxyl groups over the naturally occurring mixture of hydrogen and bridging oxygen groups reduces columnar growth during the ensuing atomic layer deposition of buffer and/or high-k metal oxide dielectric layers. For improved high dielectric constant film growth, the surface of the wafer 100 may be less than or equal to about three Angstroms root mean squared (RMS) surface variations as measured by atomic force microscopy.

Figure 2A:
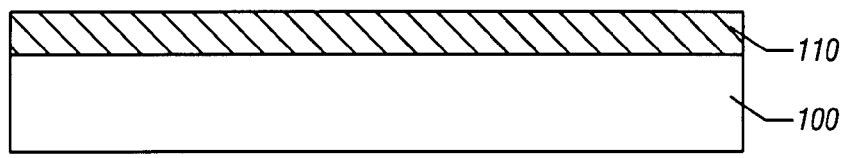
FIGS. 2A-2D represent cross-sections of structures that may be formed when carrying out an embodiment of the present invention.
Figure 2B:
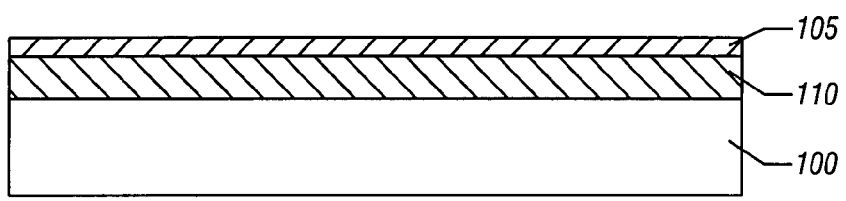
Figure 2C:
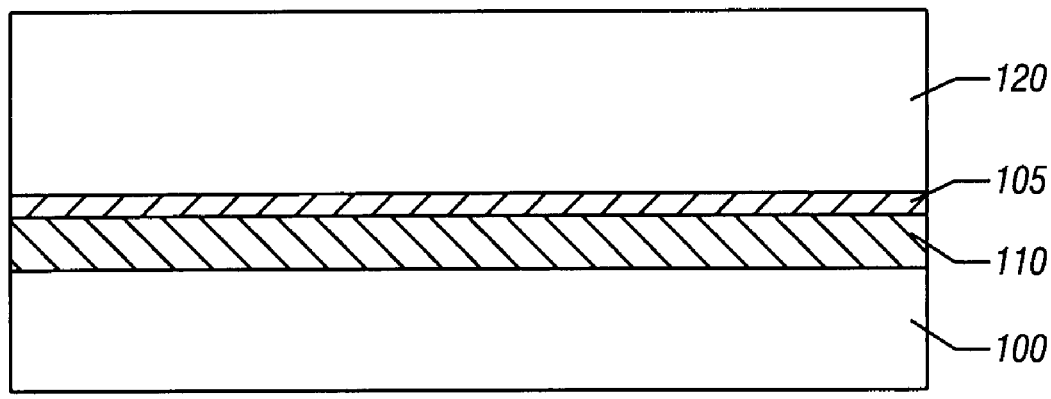
Figure 2D:
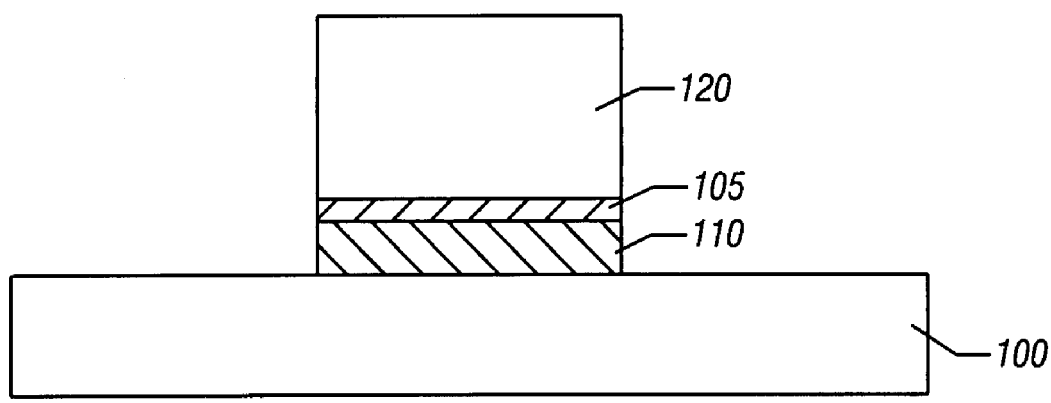

Once the surface is sufficiently smooth, the buffer layer 110 and the high-k gate dielectric layer 105 may be formed on the substrate 100 as indicated in FIGS. 2A and 2B. In one embodiment of the present invention, the buffer layer 110 is formed on the substrate 100 prior to forming the high-k gate dielectric layer 105 on the buffer layer. In another embodiment, the high-k gate dielectric layer 105 is formed directly on the substrate 100, and the buffer layer 105 is subsequently formed between the substrate 100 and the high-k gate dielectric layer 105 to separate the substrate 100 and the high-k gate dielectric layer 105.

FIGS. 2A-2D illustrate the embodiment in which the buffer layer 100 is formed on the substrate 100 prior to forming the high-k gate dielectric layer 105 on the buffer layer 110. Buffer layer 110 may be formed from any material that may ensure acceptable electron mobility on the subsequently deposited high-k film. Such materials include, for example, silicon oxides (e.g., silicon dioxide) and silicon oxynitride.

In a preferred embodiment, buffer layer 110 comprises a very thin silicon dioxide or silicon oxynitride layer that is grown using conventional thermal oxidation and/or nitridation steps. Alternatively, buffer layer 110 may be deposited using an atomic layer deposition process. Buffer layer 110 preferably is less than about 15 Angstroms thick, and more preferably between about 2 Angstroms and about 10 Angstroms thick.

In one embodiment of the present invention, the buffer layer 110 may be from about 2 to about 4 Angstroms thick. This corresponds to about 1 monolayer of thickness. The monolayer buffer layer 110 may be grown at 20 to 30° C. with 4 to 9% unstabilized $H_2O_2$ solution in deionized water.

A bilayer growth of about 5 to 7 Angstroms may be accomplished using 35 to 45° C. with 4 to 9% unstabilized $H_2O_2$ solution in deionized water. Surprisingly, it is found that the saturation current of the resulting transistors may be higher with the bilayer growth than the monolayer growth in some embodiments.

As still another example, a trilayer growth may be done to a thickness of 8 to 10 Angstroms at a temperature of 35 to 65° C. with 25 to 45% unstabilized $H_2O_2$ solution in deionized water.

After forming buffer layer 110, high-k gate dielectric layer 105 is deposited on its surface, generating the FIG. 2B structure. Materials that may be used to make high-k gate dielectrics include: hafnium oxide, lanthanum oxide, lanthanum aluminum oxide, zirconium oxide, zirconium silicon oxide, titanium oxide, tantalum oxide, yttrium oxide, and aluminum oxide. Particularly preferred are hafnium oxide, zirconium oxide, titanium oxide, and aluminum oxide. Although a few examples of materials that may be used to form dielectric layer 105 are described here, that layer may be made from other materials that serve to reduce gate leakage.

High-k gate dielectric layer 105 may be formed on buffer layer 110 using a conventional atomic layer chemical vapor deposition (CVD) process. In such a process, a metal oxide precursor (e.g., a metal chloride) and steam may be fed at selected flow rates into a CVD reactor, which is then operated at a selected temperature and pressure to generate an atomically smooth interface between buffer layer 110 and dielectric layer 105. The CVD reactor should be operated long enough to form a layer with the desired thickness. In a preferred embodiment, dielectric layer 105 is an ultra-thin layer, i.e., a layer that is less than about 20 Angstroms thick, and more preferably that is between about 5 Angstroms and about 20 Angstroms thick.

The high-k gate dielectric layer 105 may then be reoxidized. In a preferred embodiment, a plasma assisted oxidation process may be used to reoxidize high-k gate dielectric layer 105. In such a process, the surface of high-k gate dielectric layer 105 may be oxidized by exposing that surface to ionized oxygen species generated by a plasma source. Such ionized oxygen species may be generated, for example, by feeding oxygen, nitrous oxide or a mixture of oxygen and nitrous oxide into the reactor, and then striking a plasma within the reactor. Alternatively, the plasma may be stricken remotely, and then the resulting ionized oxygen species may be fed into the reactor.

Ionized oxygen species may also be created by striking a plasma remotely using a carrier gas, e.g., argon or helium, feeding the resulting ionized components into the reactor, then feeding oxygen, nitrous oxide or a mixture of oxygen and nitrous oxide into the reactor—downstream from the plasma source.

When a plasma assisted oxidation process is used to reoxidize dielectric layer 105, the reactor should be operated under the appropriate conditions (e.g., pressure, radio frequency, and power) for a sufficient time to significantly increase the ratio of oxygen to metal at the surface of the dielectric layer, thereby reducing oxygen vacancies present in that layer. In this embodiment, that reoxidation step preferably takes place at a relatively low temperature, e.g., at a temperature that is less than about 500° C.

As an alternative to using a plasma assisted oxidation process to reoxidize high-k gate dielectric layer 105, a thermal oxidation process (which takes place in an appropriate oxidizing ambient) may be used. For example, a rapid thermal oxidation step, which occurs at less than about 600° C. and lasts for less than about 60 seconds, may be adequate to increase the ratio of oxygen to metal to an acceptable level. A 400° C., 30 second, rapid thermal oxidation treatment appears to give satisfactory results. By reoxidizing high-k gate dielectric layer 105 at a relatively low temperature for a relatively short time period, the high-k gate dielectric layer may retain its amorphous state, and the amount of oxygen that diffuses to the silicon interface may be reduced. This, in turn, may limit the amount of additional oxide that is grown at that interface—ensuring that the thickness of buffer layer 110 will remain substantially unchanged.

As an alternative to using a plasma assisted oxidation process or a thermal oxidation process, a chemical oxidation, steam oxidation, ozone clean, or peroxide clean process may be used to reoxidize high-k gate dielectric layer 105. Various combinations of these processes, e.g., certain wet/dry oxidation steps, may also be employed. The process used to oxidize high-k gate dielectric layer 105 is not limited to those listed above. The method of the present invention contemplates using any suitable oxidizing step that takes place in any suitable oxidizing ambient, or any acceptable chemical treatment that causes the ratio of oxygen to metal in high-k gate dielectric layer 105 to increase.

After oxidizing high-k gate dielectric layer 105, a gate electrode may be formed on it. In a preferred embodiment, the gate electrode may be formed by initially depositing polysilicon layer 120 on high-k gate dielectric layer 105—generating the FIG. 2C structure.

Polysilicon layer 120 may be deposited using conventional methods and preferably is between about 500 Angstroms and about 4,000 Angstroms thick. After etching layers 120, 105 and 110 to form the FIG. 2D structure, using conventional techniques, additional steps that are generally used to complete the gate electrode (e.g., forming a silicide (not shown) on the upper part of etched polysilicon structure 130) may be applied. As such steps are well known to those skilled in the art, they will not be described in more detail here. Although the gate electrode preferably comprises polysilicon, it may alternatively be formed from various metals that may be used with the above described high-k gate dielectrics.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A semiconductor structure comprising:
a substrate having an oxygen atom coupled to said substrate, said oxygen atom bonded directly to at least two hydroxyls; and
a high-k gate dielectric layer over said hydroxyls.

2. The semiconductor structure of claim 1 wherein said oxygen atom coupled to said substrate is coupled to said hydroxyls through a metal atom.

3. The semiconductor structure of claim 1, wherein said layer includes a metal oxide layer.

4. The semiconductor structure of claim 3 including a buffer layer between said metal oxide layer and said substrate.

5. The semiconductor structure of claim 4 wherein said buffer layer is between one and three monolayers thick.

6. The semiconductor structure of claim 1 wherein said dielectric layer has a dielectric constant greater than ten.

* * * * *